United States Patent
Cowley et al.

(10) Patent No.: US 11,721,710 B2
(45) Date of Patent: Aug. 8, 2023

(54) STITCHED INTEGRATED CIRCUIT DIES

(71) Applicant: SEMICONDUCTOR COMPONENTS INDUSTRIES, LLC, Phoenix, AZ (US)

(72) Inventors: Nicholas Paul Cowley, Wroughton (GB); Andrew David Talbot, Chieveley (GB)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 249 days.

(21) Appl. No.: 16/949,323

(22) Filed: Oct. 26, 2020

(65) Prior Publication Data

US 2021/0202555 A1 Jul. 1, 2021

Related U.S. Application Data

(60) Provisional application No. 62/954,809, filed on Dec. 30, 2019.

(51) Int. Cl.
*H01L 27/146* (2006.01)
*G03F 1/38* (2012.01)
*G03F 1/42* (2012.01)

(52) U.S. Cl.
CPC ......... *H01L 27/14625* (2013.01); *G03F 1/38* (2013.01); *G03F 1/42* (2013.01); *H01L 27/14605* (2013.01); *H01L 27/14687* (2013.01)

(58) Field of Classification Search
CPC ......... H01L 27/14625; H01L 27/14605; H01L 27/14687; H01L 27/14609; H01L 27/0207; G03F 1/38; G03F 1/42; H04N 5/2254; H04N 5/23229; H04N 5/2624; H04N 5/265

See application file for complete search history.

(56) References Cited

U.S. PATENT DOCUMENTS

| | | | |
|---|---|---|---|
| 8,225,260 B2 * | 7/2012 | Huynh | G06F 30/392 716/135 |
| 10,497,693 B1 * | 12/2019 | Huang | H01L 27/0924 |
| 2019/0164899 A1 | 5/2019 | Hu et al. | |
| 2019/0280028 A1 * | 9/2019 | de Haan | H04N 5/32 |
| 2020/0373339 A1 * | 11/2020 | Lee | H01L 27/14605 |

FOREIGN PATENT DOCUMENTS

EP 1083462 A1 3/2001

* cited by examiner

*Primary Examiner* — Nghia M Doan
(74) *Attorney, Agent, or Firm* — Treyz Law Group, P.C.; Tianyi He

(57) ABSTRACT

An image sensor may be implemented using a stitched image sensor die. The stitched image sensor die may be formed from a step and repeat exposure process using a set of physical tiles in a reticle set. The physical tiles may include a center tile forming pixel circuitry on the image sensor die and peripheral tiles forming non-pixel circuitry on the image sensor die. Each of the physical tiles may be sized based on an integer multiple of a virtual unit tile. As such, the physical tiles may have dimensions that are not required to be an integer multiple of the smallest physical tile. The step and repeat exposure process may use the unit lengths of the virtual unit tile to properly position the die relative to the processing tools.

20 Claims, 5 Drawing Sheets

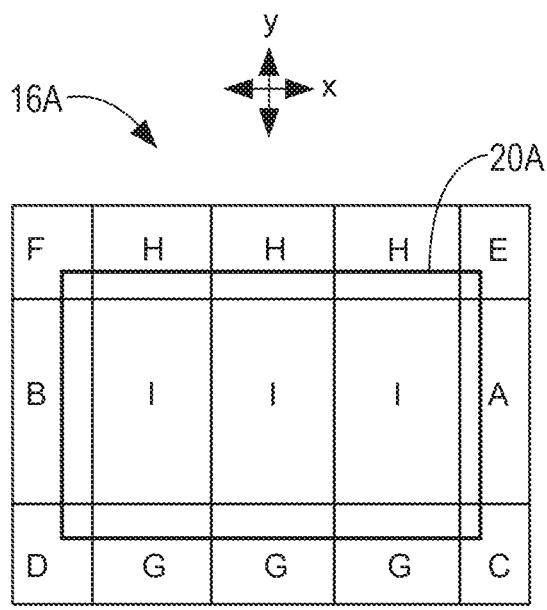
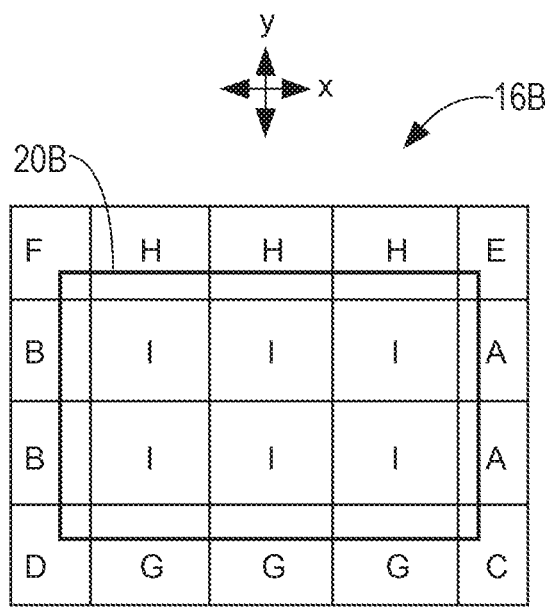
FIG. 5A  FIG. 5B
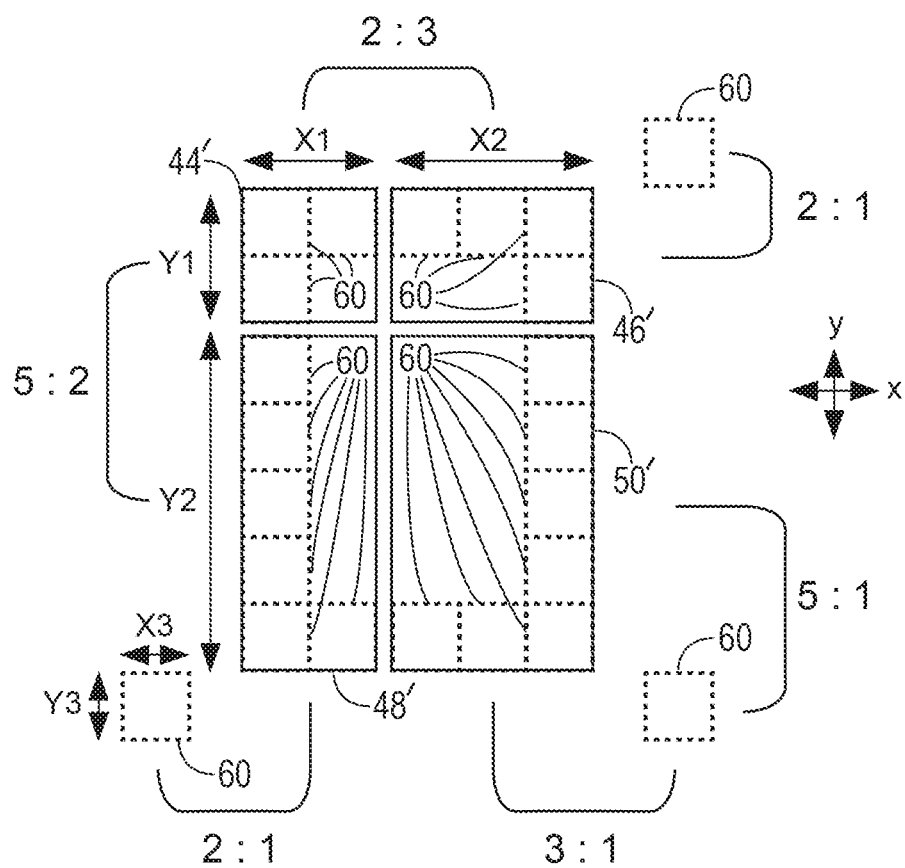
FIG. 6

STITCHED INTEGRATED CIRCUIT DIES

This application claims the benefit of U.S. provisional patent application No. 62/954,809, filed on Dec. 30, 2019, which is hereby incorporated by reference herein in its entirety.

BACKGROUND

This relates generally to imaging systems and more specifically to systems and methods for optimizing tile design in a reticle set and IP (intellectual property) circuitry block partitioning for stitched image sensors.

In some applications, image sensor integrated circuit dies on a wafer are each formed by combining or stitching multiple instances of selected tiles in the same reticle set (e.g., by stepping and repeatedly exposing the wafer at different locations using tiles in the same reticle set). The tiles in the reticle set are typically designed to include patterns defining one or more peripheral circuitry tiles and one or more pixel tiles, where the pattern image on each tile defines a corresponding (IP) circuitry block used to perform respective functions at a corresponding location on the image sensor die.

However, traditional systems and methods of designing the tiles for the reticle set and therefore partitioning the IP circuitry blocks associated with the corresponding tiles on the image sensor dies can be restrictive and can lead to inefficiently formed image sensor dies. As an example, the dimensions of the reticle set and the dimensions of each type of tile relative to each other can be restricted due to constraints in the manufacturing process, thereby undesirably limiting the specifications of the image sensor dies formed by stitching these tiles (e.g., limiting the possible pixel resolutions of the formed image sensor dies especially for ultra-high resolutions in large array image sensors).

It is within this context that the embodiments herein arise.

BRIEF DESCRIPTION OF THE DRAWINGS

FIGS. 5A and 5B are diagrams of two illustrative integrated circuit die layouts formed using tiles from the reticle set of FIG. 4 in accordance with some embodiments.

FIG. 6 is a diagram of four illustrative physical tiles designed based on a virtual unit tile and having corresponding dimensions with non-integer multiples of the smallest physical tile in accordance with some embodiments.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
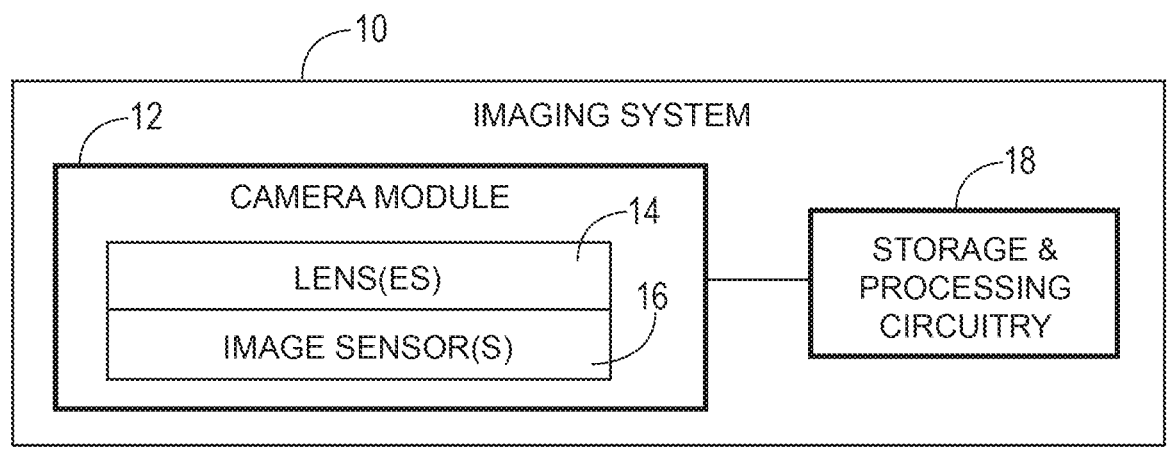
FIG. 1 is a diagram of an illustrative electronic device having an image sensor and processing circuitry for capturing images in accordance with some embodiments.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, an augmented reality and/or virtual reality system, an unmanned aerial vehicle system (e.g., a drone), an industrial system, or any other desired imaging system or device that captures digital image data. Camera module 12 (sometimes referred to as an imaging module) may be used to convert incoming light into digital image data. Camera module 12 may include one or more lenses 14 and one or more corresponding image sensors 16. During image capture operations, light from a scene may be focused onto image sensor 16 by lenses 14. Image sensor 16 may include circuitry for converting analog pixel image signals into corresponding digital image data that is provided to storage and processing circuitry 18.

Storage and processing circuitry 18 may include one or more integrated circuits (e.g., image processing circuits, microprocessors, storage devices such as random-access memory and non-volatile memory, etc.) and may be implemented using components that are separate from the camera module and/or that form part of the camera module (e.g., circuits that form part of an integrated circuit that includes image sensors 16 or an integrated circuit within the module that is associated with image sensors 16). When storage and processing circuitry 18 is included on different integrated circuits than those of image sensors 16, the integrated circuits with circuitry 18 may be vertically stacked or packaged with respect to the integrated circuits with image sensors 16. Image data that has been captured by the camera module may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, an external display, or other devices) using wired and/or wireless communications paths coupled to processing circuitry 18.

Figure 2:
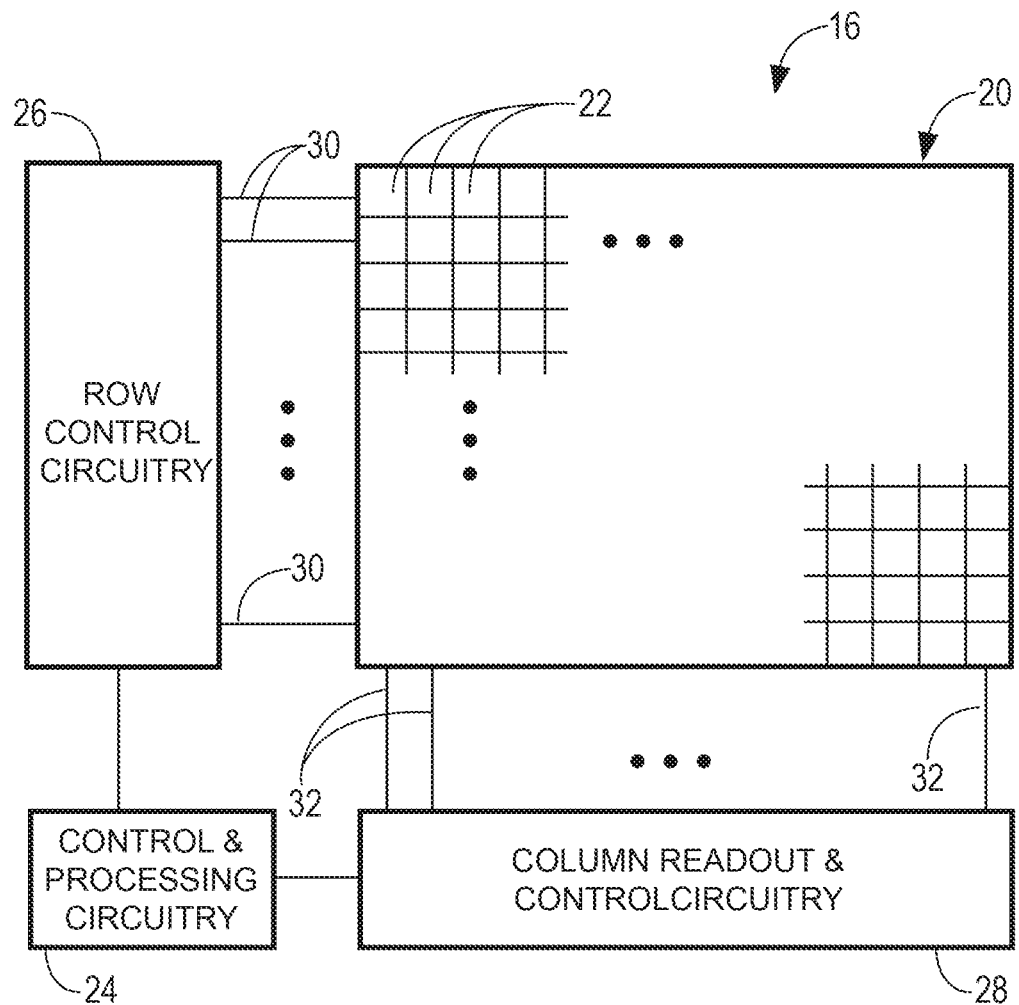
FIG. 2 is a diagram of an illustrative pixel array and associated control and readout circuitry for controlling the pixel array and reading out image signals from the pixel array in accordance with some embodiments.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 (sometimes referred to as row driver circuitry or row drivers) and column readout circuitry 28 (sometimes referred to as column control circuitry, image readout circuitry, readout circuitry, processing circuitry, or column decoder circuitry). Row control circuitry 26 may receive row addresses from control circuitry 24 and supply corresponding row control signals such as reset, anti-blooming, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Column readout circuitry 28 may receive image signals (e.g., analog pixel values generated by pixels 22) over column lines 32. Column readout circuitry 28 may include memory circuitry for temporarily storing calibration signals (e.g., reset level signals, reference level signals) and/or image signals (e.g., image level signals) read out from array 20, amplifier circuitry or a multiplier circuit, analog to digital conversion (ADC) circuitry, bias circuitry, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Column readout circuitry 28 may supply digital pixel data to control and processing circuitry 24 and/or processor 18 (FIG. 1) for pixels in one or more pixel columns.

Pixel array 20 may also be provided with a filter array having multiple (color) filter elements (each corresponding to a respective pixel) which allows a single image sensor to sample light of different colors or sets of wavelengths. As an example, image sensor pixels such as the image pixels in array 20 may be provided with a color filter array having red, green, and blue filter elements, which allows a single image sensor to sample red, green, and blue (RGB) light using corresponding red, green, and blue image sensor pixels arranged in a Bayer mosaic pattern.

In other suitable examples, the green pixels in a Bayer pattern may be replaced by broadband image pixels having broadband color filter elements (e.g., clear color filter elements, yellow color filter elements, etc.), or one of the green pixels in a Bayer pattern may be replaced by infrared (IR) image pixels formed under IR color filter elements and/or the remaining red, green, and blue image pixels may also be sensitive to IR light (e.g., may be formed under filter elements that pass IR light in addition to light of their respective colors). These examples are merely illustrative and, in general, filter elements of any desired color and/or wavelength and in any desired pattern may be formed over any desired number of image pixels 22.

Image sensor 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices technology. Image pixels 22 may be frontside illumination (FSI) image pixels or backside illumination (BSI) image pixels. If desired, image sensor 16 may include an integrated circuit package or other structure in which multiple integrated circuit substrate layers or chips are vertically stacked with respect to each other.

In some applications, image sensor 16 in FIGS. 1 and 2 may be implemented using a stitched image sensor die. In particular, a stitched image sensor die (e.g., formed using one-dimensional or two-dimensional stitching) may be constructed from a step and repeat exposure process using a small number of tiles, such as four tiles, contained on a single reticle set (e.g., each of the same tile may be exposed at multiple locations across the image sensor die).

Figure 3:
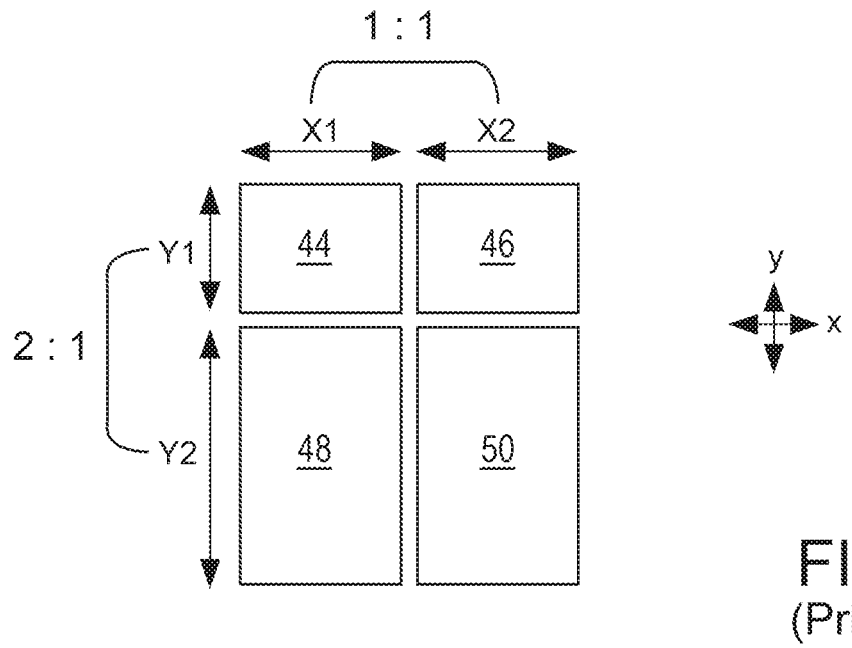
FIG. 3 is a diagram of four illustrative physical tiles having corresponding dimensions with integer multiples of the smallest physical tile in accordance with some embodiments.

FIG. 3 is a diagram of four illustrative tiles in a traditional reticle set where the dimensions of the tiles may not be optimally designed or formed. In the example of FIG. 3, tiles 44, 46, 48, and 50 each have the same length in a first dimension such as the x-dimension (e.g., length X1 may be equal to length X2, the ratio of X2 to X1 is 1:1, or in other words, integer ratio N is 1), and tiles 48 and 50 each have a length in a second dimension such as the y-dimension that is double the length of tiles 44 and 46 (e.g., length Y2 may be two times the length Y1, the ratio of Y2 to Y1 is 2:1, or in other words, integer ratio M is 2). This example in FIG. 3 is merely illustrative. If desired, the dimensions of tiles 44, 46, 48, and 50 may be suitably adjusted (e.g., to have the ratio of X2 to X1 be any suitable integer and/or to have the ratio of Y2 to Y1 be any suitable integer). In general, the traditional reticle set may require (e.g., because of design and processing requirements) that tiles have dimensions that are integer multiples of one another (e.g., length X2 be an integer multiple of length X1, and length Y2 be an integer multiple of length Y1).

However, having tiles with these integer multiple relationships between the dimensions can be restrictive in forming the reticle set, leading to suboptimal designs. As a particular example, it may be desirable for the ratio of X2 to X1 to be larger than 1 as the ratio of X2 to X1 being 1 leaves some of the reticle space unutilized, but the ratio of X2 to X1 being 2 may exceed the reticle size limit (e.g., the sum of X2 and X1 may be larger than the total allowable length of the reticle set along the x-dimension). This forces a suboptimal design with tile lengths having 1 as the ratio of X2 to X1. This along with other issues associated with this type of traditional reticle set design and corresponding manners to mitigate these issues are described herein in greater detail.

Figure 4:
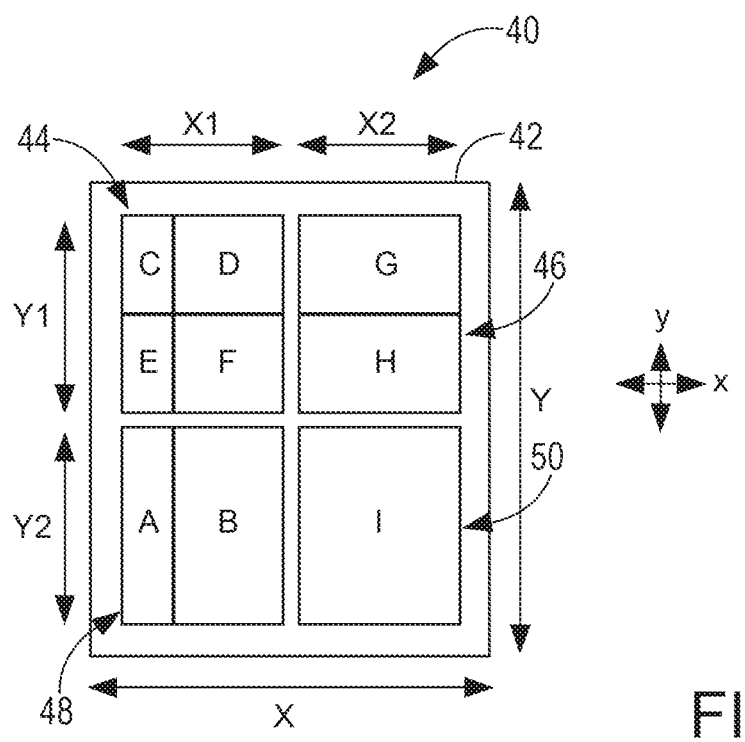
FIG. 4 is a diagram of an illustrative reticle set having tiles useable in forming a stitched integrated circuit die in accordance with some embodiments.

In particular, FIG. 4 is a diagram of an illustrative reticle set 40 (e.g., 2-D stitched mask set) containing four tiles 44, 46, 48, and 50. In the example of FIG. 4, tile 48 (e.g., a left and right peripheral tile) includes portions A and B, where portion B contains the circuit design (e.g. circuit pattern for exposure or pattern image) for the left-side peripheral circuitry and portion A contains the circuit design for the right-side peripheral circuitry. Tile 46 (e.g., a top and bottom peripheral tile) includes portions G and H, where portion G contains the circuit design for the bottom-side peripheral circuitry and portion H contains the circuit design for the top-side peripheral circuitry. Tile 44 (e.g., a corner peripheral tile) includes portions C, D, E, and F, where portion C contains the circuit design for the bottom-right corner peripheral circuitry, portion D contains the circuit design for the bottom-left corner peripheral circuitry, portion E contains the circuit design for the top-right corner peripheral circuitry, and portion F contains the circuit design for the top-left corner peripheral circuitry. Tile 50 (e.g., a center tile) having portion I may contain the circuit design for active pixel circuitry (e.g., for pixel array 20 in FIG. 2).

In some configurations, the peripheral tiles 44, 46, and 48 may each include non-pixel circuitry (e.g., non-pixel IP) such as processing circuitry, storage circuitry, power management circuitry, system clock circuitry, control circuitry for controlling pixel circuitry (e.g., control circuitry 24, 26, and/or 28 in FIG. 2), readout circuitry for reading out signals from pixel circuitry (e.g., readout circuitry 28 in FIG. 2), pixel circuitry (e.g., pixel IP) such as reference pixels, keep out zone (KOZ) pixels, and active pixels (e.g., implementing some portion of pixels in array 20 in FIG. 2), and/or any other suitable circuitry. In these configurations, the center tile may include only active pixel circuitry implementing active pixels (e.g., implementing the majority of pixels in array 20 in FIG. 2). These examples are merely illustrative. If desired, each tile may include any suitable circuitry.

In the example of FIG. 4, reticle set 40 may have a reticle (size) limit indicated by box 42 having a first length X along a first dimension (e.g., the x-dimension) and a second length Y along a second perpendicular dimension (e.g., the y-dimension). The tiles in reticle set 40 collectively need to be within the reticle size limit in order to meet processing requirements. In other words, the sum of length X1 for tiles 44 and 48 and length X2 for tiles 46 and 50 needs to be less than length X, and the sum of length Y1 for tiles 44 and 46 and length Y2 for tiles 48 and 50 needs to be less than length Y. In particular, there may be a spacing between (e.g., separating) the different adjacent tiles both along the x-dimension as well as the y-dimension from one another, and there may be a border spacing around the composite perimeter of the tiles (e.g., around the four tiles 44, 46, 48, and 50).

Additionally, to construct the stitched image sensor die, some tiles such as peripheral circuity tiles 46 and 48, and center pixel tile 50 may be exposed (e.g., stamped) multiple times at multiple locations (e.g., by stepping) across the die. To facilitate the stepping and stamping process, dimensions of tiles 44, 46, 48, and 50 may typically be constrained to be an integer multiple of corresponding dimension of other tiles, independently in both the x-dimension and the y-dimension.

In other words, in this example, if tile 44 is 1 unit in the x-dimension (e.g., length X1 is 1 unit), the other tiles must be N units in the x-dimension, where N is an integer number (e.g., length X2 is 1 unit, 2 units, 3 units, or any other integer multiple of length X1). Similarly, in this example, if tile 44 is 1 unit in the y-dimension (e.g., length Y1 is 1 unit), the other tiles must be M units in the y-dimension, where M is an integer number that may be the same as or different from integer number N (e.g., length Y2 is 1 unit, 2 units, 3 units, or any other integer multiple of Y1). In the example of FIG. 4, tiles 44, 46, 48, and 50 each have the same size (e.g., a tile length to tile length ratio of 1:1 for all four tiles across both dimensions), and the integer N (e.g., length X2 to length X1) and integer M (e.g., length Y2 to length Y1) are both equal to 1.

In particular, the integer multiple relationship between the corresponding dimensions of tiles 44, 46, 48, and 50 allows processing tools (e.g., positioner or stepper tools, alignment tools, exposure tools, etc.) to position each current instance of a first tile relative to the previous instance of a second tile (e.g., same or different than the first tile) during the stepping process. In other words, the processing tools can easily perform calculate the current exposure location (e.g., using dead reckoning) based on the size of the tile(s) for the current and previous instances and the integer multiple relationship between the current tile instance and the previous tile instance (e.g., using integers N and/or M).

In some configurations, peripheral tiles 44, 46, and 48 may be smaller than center tile 50. Length X1 may correspond to the left/right peripheral length in the x-dimension, and length Y1 may correspond to the top/bottom peripheral length in the y-dimension. As such, it may be desirable that in these configurations, integer N and/or M (e.g., the size of the pixel tile to each of the peripheral tiles) may be large as this will maximize the pixel tile size and minimize the number of pixel tile exposures (e.g., the number of exposure steps) on an image sensor die needed to meet a given pixel resolution.

As described above, a stitched image sensor die may be built up from multiple exposures of the individual tiles. FIGS. 5A and 5B are two illustrative diagrams showing two different die layouts formed from a reticle set of the type shown in FIG. 4. As an example, image sensor 16A in FIG. 5A may have a die layout with three instances of center pixel tile 50 (e.g., in a 3×1 pattern) forming a majority of pixel array 20A and a corresponding number of peripheral tile instances (e.g., one instance of corner tile 44, one instance of left and right tile 48, and three instances of top and bottom tile 46) forming the non-pixel circuitry in image sensor 16A (and optionally a portion of the pixel circuitry such as a portion of pixel array 20A or inactive pixels). Each of the circuitry blocks or tile portions A to I may be separated from each other at stitch boundaries.

As another example, image sensor 16B in FIG. 5B may have a die layout with eight instances of center pixel tile 50 (e.g., in a 4×2 pattern) forming a majority of pixel array 20B and a corresponding number of peripheral tile instances (e.g., one instance of corner tile 44, two instances of left and right tile 48, and four instances of top and bottom tile 46) forming the non-pixel circuitry in image sensor 16B (and optionally a portion of the pixel circuitry such as a portion of pixel array 20A or inactive pixels). These examples are merely illustrative. If desired, any suitable die layout may be formed based on reticle set 40 in FIG. 4.

For some applications, in which a satisfactory die can be formed using peripheral tiles (e.g., tile 44) that are relatively small compared to the center tile (e.g., tile 50), sizing the different tiles to be integer ratios of the smallest peripheral tile (e.g., tile 40) may be sufficient to meet design requirements as the small size of the peripheral tiles can provide sufficient granularity (e.g., options) to form an appropriately sized central tile (e.g., a central pixel tile). In other word, in these applications, optimization of the dimensions of pixel tile 50 by adjusting integers N and M relative to peripheral tile 44 may be satisfactory because integers N and M can take on a large variety of values and still meet the reticle size requirement. In particular, giving flexibility in the integers N and M allows the best match to a pixel resolution requirement through the granularity.

However, in some applications such as when forming a monolithic image sensor die having substantial functionalities and circuitry (e.g., power management unit (PMU), row driver circuitry, column readout circuitry and path, sequencer circuitry, etc.) in the peripheral tiles, implementing the substantial functionalities and circuitry may require the peripheral tiles to be physically large. This may undesirably limit the possible dimensions of the center pixel tile to few possibilities because the size of the center pixel is still required to be an integer multiple of the larger peripheral tiles while meeting the reticle set size limit.

In other words, including these functionalities and circuitry in the peripheral tiles may thereby restrict the tile-to-tile ratio (e.g., integers N and/or M described above) to a small integer number such as one or two. As a consequence of this constraint of low integer ratios N or M being applied to the allocation of reticle space between the center and peripheral tiles, the center pixel tile may have smaller sizes (relative to a center pixel tile in a reticle set having smaller peripheral tiles). This causes restricted opportunities for optimization, making it difficult to efficiently meet some pixel resolution requirements or sets of pixels resolution specifications from a single reticle set in a silicon efficient manner.

In an illustrative example, it may be desirable to provide a center pixel tile having a longer first length X2 of 2 units relative to a first length X1 of 1 unit associated with a smallest peripheral tile to satisfy pixel resolution requirements and reduce the number of steps during the step and repeat exposure process. However, this may be impossible because an integer ratio of 2 (e.g., length X2 to length X1) may be too large to meet the reticle size limit (e.g., the sum of lengths X2 and X1 exceed the reticle size limit). Although a ratio between 1 and 2 (e.g., 1.5) may optimize for reticle size limit, to perform the traditional step and repeat exposure process, a non-integer ratio is not allowed. As such, an integer ratio of 1 is inefficiently and forcibly used.

To mitigate these issues, the dimensions of (physical) tiles in the reticle set may be designed based on the dimensions of a virtual unit tile. To distinguish references to the two types of tiles, the sets of tiles in the reticle set used to actually pattern the dies are referred to herein as physical tiles (e.g., tiles 44, 46, 48, and 50 in FIG. 3 or FIG. 4). The virtual unit tile is merely used to size the physical tiles and to perform positioning (e.g., alignment, dead reckoning, etc.) during the step and repeat exposure process for the physical tiles. In particular, using the dimensions of a virtual unit tile to gauge the dimensions of the physical tiles allows a larger percentage of the reticle to be allocated to the center (pixel) tile even when larger peripheral tiles are used because the physical tiles are effectively not required to have dimensions that are integer multiples of the smallest physical tile (e.g., values N and/or M are not required to be integer numbers).

FIG. 6 is a diagram of four illustrative physical tiles 44', 46', 48', and 50' in a single reticle set. In some configurations described herein as examples, physical tiles 44', 46', 48', and 50' may have corresponding portions such as portions A', B', C', D', E', F', G', H', and I' distributed in a manner analogous to that described in connection with FIG. 4. In other words, tile 44' may be corner peripheral tile having corner portions C', D', E', and F', tile 46' may be a top and bottom peripheral tile having top portion H' and bottom portion G', tile 48' may be a left and right peripheral tile having right portion B' and left portion A', and tile 50' may be a center tile having center portion I'.

Each of the physical tiles may be sized based on a virtual unit tile 60. In particular, virtual tile 60 may have a first length X3 along the first x-dimension (sometimes referred to herein as a first unit length X3) and a second length Y3 along the second y-dimension (sometimes referred to herein as a second unit length Y3). Physical tile 44' may have a first length X1 along the x-dimension that is two times the first unit length X3 and may have a second length Y1 along the y-dimension that is two times the second unit length Y3. Physical tile 46' may have a first length X2 along the x-dimension that is three times the first unit length X3 and may have a second length Y1 along the y-dimension that is two times the second unit length Y3. Physical tile 48' may have a first length X1 along the x-dimension and a second length Y2 along the y-dimension (e.g., each measured based on the corresponding unit length of the virtual tile). Physical tile 50' may have a first length X2 along the x-dimension and a second length Y2 along the y-dimension (e.g., each measured based on the corresponding unit length of the virtual tile).

As described above, each physical tile is designed to have dimensions that are integer multiples of the corresponding dimensions of the virtual unit tile. In other words, these physical tiles may be "formed" from (e.g., sized based on) an integer multiple of smaller virtual unit tiles (e.g., dimensions of a virtual unit tile may have integer ratio relationships with dimensions of each of the physical tiles). This requirement may replace the more restrictive requirement described in connection with FIGS. 3-5, where each physical tile is designed to have dimensions that are integer multiples of the corresponding dimensions of another physical tile (e.g., the smallest physical tile).

As such, the relationship between respective dimensions of physical tiles sized using the virtual unit tile dimensions are described to be an integer-to-integer ratio or a ratio of integers (e.g., a ratio of K to L, where K and L are both integers), or more specifically, a non-integer ratio of N to 1, where value N is not an integer) instead of an integer ratio (e.g., a ratio of N to 1, where value N is an integer) as described in connection with FIGS. 3-5.

In the example of FIG. 6, in the x dimension, length X2 may be three unit lengths (e.g., three times length X3) and length X1 may be two unit lengths. The ratio of X2 to X1 may be 3:2 or 1.5:1 (or simply 1.5). In the y dimension, length Y2 may be five unit lengths (e.g., five times length Y3) and length Y1 may be two unit lengths. The ratio of Y2 to Y1 may be 5:2 or 2.5:1 (or simply 2.5). As such, the corresponding values N and M described in connection with FIGS. 3-5 may be non-integer values or ratios in the example of FIG. 6 (e.g., using a virtual unit tile to size the physical tiles).

By implementing physical tiles with integer ratio relationships to a virtual unit tile, the physical tiles may be related to each other by ratios of integers (e.g., non-integer multiples), which provide more flexible tile dimensions for efficiently partitioning the tiles, thereby more efficiently forming integrated circuit dies with desirable attributes. This mitigates issues that arise from forming physical tiles that are an integer ratio with respect to one another (e.g., dimensions of any physical tile are required to be integer multiples of the dimensions of the smallest physical tile).

As described above, a virtual tile may be defined for the die exposure or patterning process (e.g., stepping and alignment process) and may not affect the circuitry design of the physical tiles in the reticle set. In particular, dimensions of a virtual unit tile may be used to step and/or align corresponding physical tiles for exposure at respective locations on the die (e.g., on a wafer containing the die and additional dies). In other words, the size of the virtual tile may be used to determine the location of the physical tile exposure. As an illustrative example, a wafer may be stepped by integer multiple units associated with the virtual tile unit dimensions (e.g., an integer multiple of unit lengths X3 and/or Y3) to provide the corresponding alignment. This may be in contrast to scenarios in which virtual tiles and corresponding virtual tile unit dimensions are not used, where the wafer is stepped by integer multiples of the entire dimensions of the physical tiles (e.g., an integer multiple of lengths of X1 and/or Y1 in FIG. 5). In particular, the integer multiple of virtual tile unit lengths to be stepped may be indicated by the number of virtual tiles forming the corresponding physical tile to be stamped.

As an example, the wafer may be stepped over two unit lengths for a physical tile having a length in the first dimension two times the unit length of the virtual tile in the first dimension (e.g., for a physical tile to virtual tile length ratio of 2:1). As another example, the wafer may be stepped three unit lengths for a physical tile having a length in the first dimension three times the unit length of the virtual tile in the first dimension (e.g., for a physical tile to virtual tile ratio of 3:1).

Figure 7A:
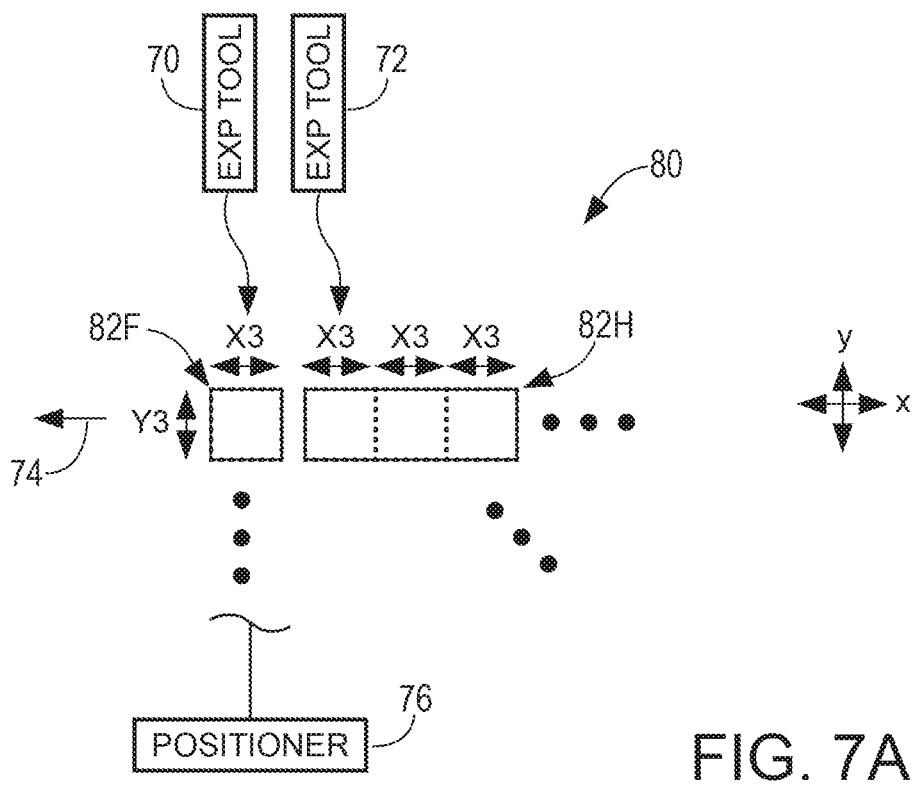
FIGS. 7A and 7B are diagrams of respective portions of two different illustrative image sensor dies formed using physical tiles from corresponding reticle sets, each physical tile based on a virtual unit tile, in accordance with some embodiments.
Figure 7B:
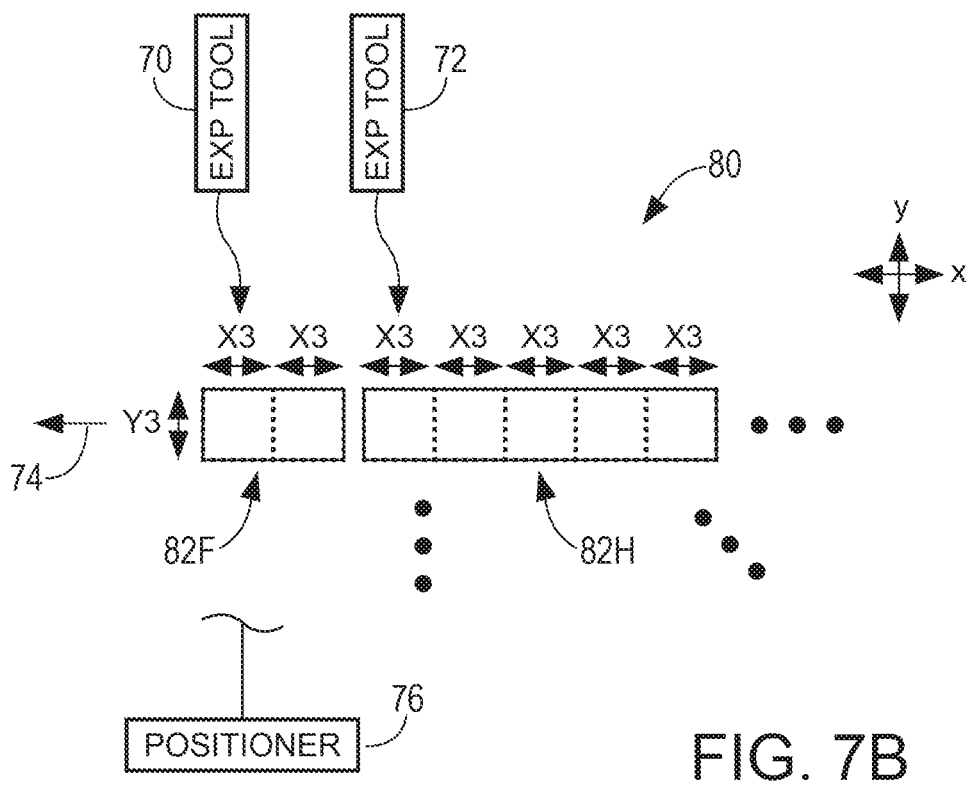

FIGS. 7A and 7B are two illustrative examples of a portion of a die layout for die 80. In the example of FIG. 7A, the circuit design on tile portion 82F (corresponding to a top-left tile portion) may be exposed at a first location on die 80 using exposure tool 70 based on a physical tile such as corner tile 44' in FIG. 6. In this example, tile portion 82F may have the same dimensions as a virtual tile (e.g., may have a first length X3 and a second length Y3). Subsequently, die 80 may be moved using positioner 76 (e.g., using a stepper coupled to a wafer on which multiple dies 80 are processed) in direction 74 relative to exposure tool 70. In such a manner, exposure tool 70 may be positioned at a new location 72 to perform the next exposure of the circuit design on tile portion 82H (corresponding to a top tile portion) at a second location on die 80 using exposure tool 70 based on a physical tile such as peripheral tile 46' in FIG. 6. In particular, positioner 76 may perform alignment between exposure tool 70 and the wafer based on moving the wafer and die 80 in increments of the virtual tile unit length X3 (e.g., moving a total distance that is an integer multiple of virtual tile unit length X3).

In the example of FIG. 7A, positioner 76 may move the wafer a distance of one times the unit length X3 relative to exposure tool 70 from the first location to the second location. Subsequently, positioner 76 may move the wafer a distance of three times the unit length X3 relative to exposure tool 70 from the second location to a third location. However, this is merely illustrative. If desired, depending on the physical tile dimensions and the virtual tile dimensions, positioner 76 may move the wafer any suitable distance relative to exposure tool 72. FIG. 7B shows another illustrative example of how positioner 76 may move the wafer based on a different die layout.

In the example of FIG. 7B, tile portion 82F may have a length along the first dimension (e.g., the x-dimension) that is two times the virtual tile unit length X3, and tile portion 82H may have a length along the first dimension that is five times the virtual tile unit length X3. In the same manner as described in connection with FIG. 7A, after the circuit design on tile portion 82F is exposed at a first location, positioner 76 may move the wafer to perform alignment between exposure tool 70 and the wafer at a second location and expose the circuit design on tile portion 82H at the second location. In this example, based on the relative virtual unit tile sizing, positioner 76 may move the wafer a distance of two times the unit length X3 from the first location to the second location. Subsequently, positioner 76 may move the wafer a distance of five times the unit length X3 from the second location to a third location.

The examples in FIGS. 7A and 7B are merely illustrative. While, in the examples of FIGS. 7A and 7B, alignment or stitching occurs in one dimension, positioner 76 may move (e.g., align) the wafer in the second dimension (e.g., in the y-dimension) based on the virtual tile unit in the second dimension alone or in combination with the movements in the first dimension. If desired, exposure tool 70 may be moved instead of the wafer for alignment. If desired, any other alignment operations may occur based on the virtual unit tile dimension during wafer processing.

Figure 8:
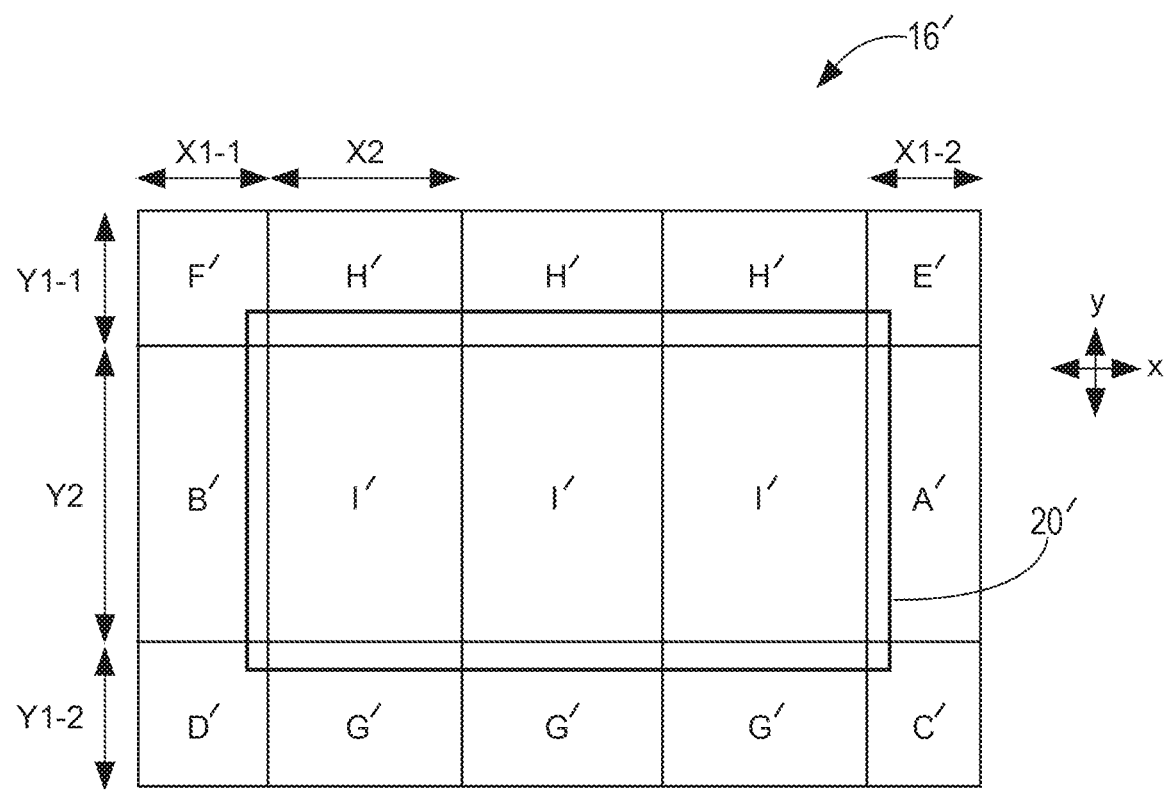
FIG. 8 is a diagram of an illustrative integrated circuit die layout formed using a reticle set such as the reticle set of FIG. 6 having physical tiles based on a virtual unit tile in accordance with some embodiments.

FIG. 8 is a diagram of an illustrative die layout for image sensor 16' formed from a reticle set having physical tiles based on virtual tiles of the type shown in FIG. 6. In particular, image sensor 16' may be formed from three instances of center pixel tile 50' in FIG. 6 forming the majority of pixel array portion 20'. Image sensor 16' may also be formed from three instances of top and bottom peripheral tile 46', two instances of left and right peripheral tile 48', and one instance of corner peripheral tile 50'.

In particular, by using virtual tiles to form the physical tiles in the reticle set, pixel area of pixel array 20' may be optimized. In particular, left peripheral tile portions F', B', and D' may have length X1-1 in the x-dimension, right peripheral tile portions E', A', and C' may have length X1-2 in the x-dimension, and top and bottom peripheral tile portions H' and G', and center tile portions I may have length X2 in the x-dimension. The sum of lengths X1-1 and X1-2 may be length X1 (FIG. 6). The ratio of X2 to X1 may be an integer-to-integer ratio (e.g., a non-integer ratio such as a ratio of N to 1, where N is not an integer). Similarly, top peripheral tile portions F' H', and E may have length Y1-1 in the y-dimension, bottom peripheral tile portions D', G', and C' may have length Y1-2 in the y-dimension, and left and right peripheral tile portions B' and A' and center tile portion I may have length Y2 in the y-dimension. The sum of lengths Y1-1 and Y1-2 may be length Y1 (FIG. 6). The ratio of Y2 to Y1 may be an integer-to integer ratio (e.g., a non-integer ratio of M to 1, where M is not an integer). Each of the circuitry blocks or tile portions A' to I' may be separated from each other at stitch boundaries.

The embodiments described herein may be implemented in a system (e.g., an imaging system, an image sensor, etc.), may be implemented on processing circuitry (e.g., by executing instructions stored on a non-transitory computer readable storage medium), may be implemented on fabrication devices (e.g., control circuitry for a positioner, an exposure tool, and/or any other processing equipment), or may be implemented in any suitable manner. As an example, systems and methods for forming physical tiles based on virtual tiles may form stitched integrated circuit dies where physical tiles (e.g., defined by stitch boundaries) are related to one another by a ratio of integers (e.g., by a non-integer ratio) in the x-dimension and/or the y-dimension.

The embodiments herein may advantageously retain the desired feature for a manufacturing process (e.g., an alignment or positioning process) using integer relationships between the constituent tiles in a reticle set for stitching, while delivering finer granularity in the resultant physical size of each tile, thereby allowing a greater flexibility in allocating functionality to the different physical tiles. This may be particularly advantageous for monolithic image sensors where the peripheral tiles may occupy a significant proportion of the reticle set limit lengths (e.g., in the x-dimension and in the y-dimension). However, the example of monolithic image sensors in implementing the embodiments herein is merely illustrative. If desired, other types of image sensors or integrated circuit dies may also implement (e.g., be formed using) the embodiments herein.

As an example, the arrangements of these monolithic image sensors or other suitable systems may restrict the physical tiles to integer multiples of the smallest physical tile, for example having physical tile length ratios of 1:1 or 2:1. However, the embodiments herein may allow for a greater range of ratios and hence greater flexibility in designing and allocating circuitry to the physical tiles. For example, in some scenarios (e.g., in the example of FIG. 6), if the virtual tile is 0.25 times the smallest physical tile, then physical tile length ratios of 4:4, 5:4, 6:4. 7:4 and 8:4 could be achieved, thereby giving twice the number of options. As the virtual tile size has no restrictions, with even smaller virtual tile sizes, physical tile length ratios of 5:5, 6:5, 7:5 8:5 9:5 and 10:5 may also be realized, thereby allowing the number of options to increase further.

As a particular example, consider a monolithic image sensor where the peripheral IPs and reference/buffer pixels result in a left and right peripheral physical tile length in the x-dimension of 8 mm and a top and bottom peripheral physical tile length in the y-dimension of 12 mm. The reticle size limit dimensions may typically be 25×32 mm and the spacing between physical tiles may be 1.5 mm. This example may assume that the top and bottom peripheral physical tile length in the y-dimension is aligned along the longer axis of reticle size limit dimension.

In this example, if an integer ratio between physical tiles is used, peripheral physical tile height is 12 mm. If, as a first example, given a length ratio of 1:1 between the physical pixel tile and the peripheral physical tile in the y-dimension, the total length in the y-dimension may be determined by 12+12+1.5 (spacing)=25.5 mm. If, as a second example, given a length ratio of 2:1 between the physical pixel tile and the peripheral physical tile in the y-dimension, the total length in the y-dimension may be determined by 2*12+12+ 1.5 (spacing)=37.5 mm. Clearly, the length ratio M (as described in connection with FIG. 4) can only be one given that the total length in the y-dimension in the second example exceeds the reticle set size of 32 mm (e.g., the maximum sum of lengths in the y-dimension for the peripheral physical tile and pixel physical tile must be (32−1.5)/2=15.5 mm).

If a ratio of integers between physical tiles is used (e.g., using virtual tiles having integer ratios to physical tiles), the split between the peripheral physical tile length and pixel physical tile length in the y-dimension may be better optimized. In particular, assuming virtual tile length in the y-dimension is 3 mm and peripheral physical tile length in the y-dimension is 12 mm, a pixel physical tile length to peripheral physical tile length ratio of 6:4 may be used, which results in the total length in the y-dimension to be 6*3+4*3+1.5=31.5 mm, which maximises reticle set size usage. This approach delivers a peripheral tile length in the y-dimension of 12 mm and a pixel physical tile length in the y-dimension of 18 mm, thereby increasing the pixel physical tile size by 16% (compared to the above integer ratio between physical tiles example).

The systems and methods described herein enable more flexibility in meeting requested resolutions, especially given larger peripheral circuitry and other constraints. The systems and methods described herein enable greater flexibility in allocating circuitry to corresponding physical tiles so as to give greater flexibility in defining granularity (e.g., resulting in larger numbers of pixel resolutions serviced by a single reticle mask set). As a particular example, the systems and methods described herein may increase the number of achievable pixel rows/columns (for a given pixel resolution) even given certain system constraints. Altogether, the systems and methods described herein allow for flexibility in pixels resolutions and implementation from a single reticle mask set.

Various embodiments have been described illustrating systems and methods for optimizing reticle set design and IP circuitry block partitioning for stitched image sensors.

As an example, an image sensor may be implemented using a stitched image sensor die processed as part of a larger wafer containing other dies. The stitched image sensor die may be formed from a step and repeat exposure process using a set of physical tiles in a reticle set. In particular, the wafer may be coupled to a positioner (e.g., a stepper) that moves the wafer from location to location relative to the processing tools (e.g., the exposure tools). At each location, a corresponding physical tile may be exposed or stamped. In such a manner, the image sensor die may be built up or stitched from one or more instances of the same set of physical tiles.

In some configurations, the physical tiles may include a center tile forming pixel circuitry on the image sensor die and peripheral tiles forming non-pixel circuitry on the image sensor die (and optionally pixel circuitry). Each of the physical tiles may be sized based on an integer multiple of a virtual unit tile. In particular, the virtual unit tile may have or define a first unit length along a first x-dimension and a second unit length along a second y-dimension. Each physical tile may have a first length in the x-dimension that is an integer multiple of the first unit length and a second length in the y-dimension that is an integer multiple of the second unit length. By using the virtual unit tile as the base unit of measure for alignment and positioning during processing, the physical tiles may have dimensions that are not required to be an integer multiple of the smallest physical tile (e.g., the smallest physical tile does not need to serve as the base unit of measure for alignment positioning during processing). In such a manner, the step and repeat exposure process may use the unit lengths of the virtual unit tile to properly position the die relative to the processing tools (e.g., position based on integer multiples of the unit lengths in the x-dimension and/or the y-dimension).

If desired, embodiments of the present invention described herein can be applied to forming general integrated circuit systems such as designing and forming tiles in reticle sets and partitioning circuitry such as IP circuitry blocks on an integrated circuit die for a non-imaging system. In general, the systems and methods for forming integrated circuit dies described herein may be implemented in any suitable imaging or non-imaging system. It will be recognized by one of ordinary skill in the art, that the present exemplary embodiments may be practiced without some or all of these specific details. In other instances, well-known operations have not been described in detail in order not to unnecessarily obscure the embodiments described herein.

The foregoing is merely illustrative of the principles of this invention and various modifications can be made by those skilled in the art without departing from the scope and spirit of the invention. The foregoing embodiments may be implemented individually or in any combination.

What is claimed is:

1. A reticle set for patterning an image sensor die, the reticle set comprising:
a center tile having a first pattern image associated with pixel circuitry, the center tile having a first length along a first dimension; and
a peripheral tile having a second pattern image associated with control circuitry for the pixel circuitry, the second pattern image containing first and second pattern image portions associated with the control circuitry for the pixel circuitry that have respective lengths summing to a second length of the peripheral tile along the first dimension, wherein a ratio of the first length of the center tile to the second length of the peripheral tile is a non-integer ratio.

2. The reticle set defined in claim 1, wherein the center tile has a third length along a second dimension, the peripheral tile has a fourth length along the second dimension, wherein a ratio of the third length of the center tile to the fourth length of the peripheral tile is a non-integer ratio.

3. The reticle set defined in claim 1, wherein the center tile and the peripheral tile are sized based on a same virtual unit tile that defines a unit length along the first dimension.

4. The reticle set defined in claim 3, wherein the first length of the center tile is an integer multiple of the unit length of the virtual unit tile.

5. The reticle set defined in claim 4, wherein the second length of the peripheral tile is an integer multiple of the unit length of the virtual unit tile.

6. The reticle set defined in claim 3, wherein the center tile has a third length along a second dimension, the peripheral tile has a fourth length along the second dimension, and the virtual unit tile defines an additional unit length along the second dimension.

7. The reticle set defined in claim 6, wherein the third length of the center tile is an integer multiple of the additional unit length of the virtual unit tile.

8. The reticle set defined in claim 7, wherein the fourth length of the peripheral tile is an integer multiple of the additional unit length of the virtual unit tile.

9. The reticle set defined in claim 8, wherein a ratio of the third length of the center tile to the fourth length of the peripheral tile is a non-integer ratio.

10. The reticle set defined in claim 3, wherein the unit length of the virtual unit tile is indicative of a unit of measurement for alignment when patterning a stitched image sensor die.

11. The reticle set defined in claim 10, wherein the stitched image sensor die is stepped in integer multiples of the unit length of the virtual unit tile when patterning the stitched image sensor die.

12. A method of processing a wafer having an image sensor die, the method comprising:
forming first and second peripheral circuitry blocks by using a peripheral circuitry tile in a reticle set, wherein the first and second peripheral circuitry blocks have respective lengths along a dimension that sum to a first length; and
forming a pixel circuitry block between the first and second peripheral circuitry blocks by using a center pixel circuitry tile in the reticle set, wherein the pixel circuitry block has a second length along the dimension, and wherein a ratio of the second length to the first length is a non-integer ratio.

13. The method defined in claim 12, wherein forming the first and second peripheral circuitry blocks and forming the pixel circuitry block comprises performing a step and repeat exposure process using the reticle set.

14. The method defined in claim 13, wherein the first length associated with the first and second peripheral circuitry blocks and the second length associated with the pixel circuitry block are integer multiples of a unit length associated with a virtual tile.

15. The method defined in claim 14, wherein performing the step and repeat exposure process using the reticle set comprises stepping the wafer based on the unit length associated with the virtual tile.

16. The method defined in claim 15, wherein stepping the wafer based on the unit length associated with the virtual tile comprises, for each step in the step and repeat exposure process, stepping the wafer a distance that is an integer multiple of the unit length associated with the virtual tile.

17. The method defined in claim 12, further comprising:
forming an additional pixel circuitry block between the first and second peripheral circuitry blocks by using the center pixel circuitry tile in the reticle set, wherein the additional pixel circuitry block has the second length along the dimension, and wherein forming the pixel circuitry block and the additional pixel circuitry block comprises performing a step and repeat exposure process using the center pixel circuitry tile.

18. The method defined in claim 17, wherein the pixel circuitry block and additional pixel circuitry block form an image sensor pixel array for the image sensor die, and wherein the first and second peripheral circuitry blocks form control circuitry for the image sensor pixel array.

19. A stitched integrated circuit die comprising:
a plurality of circuitry blocks separated from one another by corresponding stitch boundaries, the plurality of circuitry blocks comprising:
a first peripheral circuitry block;
a second peripheral circuitry block, wherein the first and second peripheral circuitry blocks are formed on opposite sides of the stitched integrated circuit die and wherein the first and second peripheral circuitry blocks have respective lengths along a dimension that sum to a first length; and
a center circuitry block between the first and second peripheral circuitry blocks, wherein the center circuitry block has a second length along the dimension, and wherein a ratio of the second length to the first length is a non-integer ratio.

20. The stitched integrated circuit die defined in claim 19, wherein the center circuitry block comprises pixel circuitry forming an image sensor pixel array, and the first and second peripheral circuitry blocks comprise control circuitry for the image sensor pixel array.

* * * * *